(12) United States Patent
Curtis et al.

(10) Patent No.: US 10,418,216 B2
(45) Date of Patent: Sep. 17, 2019

(54) PHASE OPERATION INDICATOR

(71) Applicant: Intermountain Electronics, Inc., Price, UT (US)

(72) Inventors: Dale V. Curtis, Castle Dale, UT (US); Robin Vice, Phoenix, AZ (US)

(73) Assignee: Intermountain Electronics, Inc., Price, UT (US)

( * ) Notice: Subject to any disclaimer, the term of this patent is extended or adjusted under 35 U.S.C. 154(b) by 0 days.

(21) Appl. No.: 15/954,472

(22) Filed: Apr. 16, 2018

(65) Prior Publication Data

US 2018/0315573 A1 Nov. 1, 2018

Related U.S. Application Data

(60) Provisional application No. 62/491,866, filed on Apr. 28, 2017.

(51) Int. Cl.
| | | |
|---|---|---|
| *G08B 21/00* | (2006.01) | |
| *H01H 71/04* | (2006.01) | |
| *H03H 7/06* | (2006.01) | |
| *G08B 5/38* | (2006.01) | |
| *G01R 31/02* | (2006.01) | |
| *G01R 19/155* | (2006.01) | |
| *G01R 15/16* | (2006.01) | |
| *H02H 11/00* | (2006.01) | |

(52) U.S. Cl.
CPC ........... *H01H 71/04* (2013.01); *G01R 19/155* (2013.01); *G01R 31/025* (2013.01); *G08B 5/38* (2013.01); *H03H 7/06* (2013.01); *G01R 15/16* (2013.01); *H02H 11/001* (2013.01)

(58) Field of Classification Search
CPC ........ H01H 71/04; H03H 7/06; G01R 19/155; G01R 15/16; G01R 31/025; G08B 5/38; H02H 11/001
USPC ................................................. 340/638, 654
See application file for complete search history.

(56) References Cited

U.S. PATENT DOCUMENTS

| | | | | |
|---|---|---|---|---|
| 5,986,557 A | * | 11/1999 | Clarke ................... | H02H 3/046 340/638 |
| 7,164,273 B2 | * | 1/2007 | Bailey ................ | G01R 19/2513 324/508 |
| 8,013,613 B2 | * | 9/2011 | Allen, Jr. ............. | G01R 19/155 324/522 |
| 8,879,218 B2 | * | 11/2014 | Tomimbang ......... | H02H 1/0015 361/42 |

(Continued)

*Primary Examiner* — Anh V La (74) *Attorney, Agent, or Firm* — Kunzler Bean & Adamson; Bruce R. Needham (57) ABSTRACT

An apparatus for phase operation indication includes a phase filter that filters a ground monitor signal from one or more phase conductors supplying power to a load and injects the ground monitor signal in an equipment grounding conductor run with the one or more phase conductors or receives the ground monitor signal from a signal generator and injects the ground monitor signal on the one or more phase conductors. The ground monitor signal includes a test frequency different than a line frequency of power supplied to the load. The apparatus includes at least one indicator circuit connected to at least one of the one or more phase conductors. An indicator circuit of a phase conductor provides a visual flashing signal in response to a voltage being present on the phase conductor, the at least one indicator circuit located at the phase filter.

20 Claims, 6 Drawing Sheets

(56) References Cited

U.S. PATENT DOCUMENTS

| | | | | |
|---|---|---|---|---|
| 2008/0049364 A1* | 2/2008 | Campolo | ............... | H02H 3/33 |
| | | | | 361/45 |
| 2016/0313386 A1* | 10/2016 | Bugaris | ............... | G01R 19/155 |
| 2017/0131340 A1* | 5/2017 | Tallam | ............... | G01R 31/025 |
| 2017/0131341 A1* | 5/2017 | Hu | ............... | G01R 31/025 |

* cited by examiner

PHASE OPERATION INDICATOR

CROSS-REFERENCES TO RELATED APPLICATIONS

This application claims the benefit of U.S. Provisional Patent Application No. 62/491,866 entitled "PHASE OPERATION INDICATOR" and filed on Apr. 28, 2017 for Dale V. Curtis, et al., which is incorporated herein by reference.

FIELD

This invention relates to voltage indicators and more particularly relates to phase filters with an indicator that signals when a conductor is energized.

BACKGROUND

Electrical equipment is often hazardous to personnel seeking access to components within an electrical enclosure, such as an electrical equipment enclosure. Voltage indicators, circuit breakers and other equipment indicating that components and cables within an enclosure may fail or provide a false reading. For example, a circuit breaker in an enclosure may be operated where a handle or switch is moved to an open position. However, the circuit breaker may fail so that contacts of the circuit breaker remain closed while a handle indicates that the circuit breaker is open. In this condition, equipment and cables connected to the circuit breaker may be energized even though external indications on the enclosure may indicate that the circuit breaker is opened and the equipment in the enclosure is safe to touch.

SUMMARY

An apparatus for phase operation indication is disclosed. Two systems are disclosed that include the functions of the apparatus. The apparatus includes a phase filter that filters a ground monitor signal from one or more phase conductors supplying power to a load and injects the ground monitor signal in an equipment grounding conductor run with the one or more phase conductors or receives the ground monitor signal from a signal generator and injects the ground monitor signal on the one or more phase conductors. The ground monitor signal includes a test frequency different than a line frequency of power supplied to the load. The apparatus includes at least one indicator circuit connected to at least one of the one or more phase conductors. An indicator circuit of a phase conductor provides a visual flashing signal in response to a voltage being present on the phase conductor, each indicator circuit of the at least one indicator circuits located at the phase filter.

In one embodiment, the indicator circuit includes an indicator capacitor that receives charge from the connected phase conductor and a lamp circuit that discharges the indicator capacitor and provides light for the visual flashing in response to voltage across the indicator capacitor reaching a trigger voltage and stops discharging the indicator capacitor and stops providing light at a reset voltage. In another embodiment, the lamp circuit includes a neon lamp, where the neon lamp lights at the trigger voltage and stops producing light at the reset voltage. In another embodiment, the indicator circuit is a relaxation oscillator. In another embodiment, each indicator circuit of the at least one indicator circuits includes a rectification circuit that rectifies power from the connected phase conductor. In some embodiments, the visual flashing signal provides light at a frequency lower than the line frequency. In another embodiment, the test frequency is higher than the line frequency and the phase filter comprises a band pass filter that filters out the line frequency and passes the test frequency to the equipment grounding conductor or combines the test signal with the line frequency while blocking the line frequency from the signal generator.

In another embodiment, the phase filter includes a phase capacitor circuit for each of the one or more phase conductors. Each phase capacitor circuit includes a phase capacitor and each phase capacitor circuit is connected to one of the one or more phase conductors and to an input to an inductor circuit that includes an inductor. An output of the inductor circuit is connected to the equipment grounding conductor or the signal generator. In another embodiment, the indicator circuit includes a fusible resistor circuit connected in series with the inductor circuit. The fusible resistor circuit includes one or more fusible resistors connected in series, where each fusible resistor circuit forms an open circuit in response to current through the fusible resistor circuit above a current limit. In another embodiment, the fusible resistor circuit is arranged to form a gap when in an open circuit condition, where the gap has a gap length sufficient to prevent an arc forming across the gap for voltage across the gap below or equal to an upper voltage limit.

In one embodiment, each indicator circuit of the at least one indicator circuits for the one or more phase conductors is potted in a clear material that allows the visual flashing signal to be viewed through the clear material. In another embodiment, the phase filter is potted together with each indicator circuit of the at least one indicator circuits for the one or more phase conductors in the clear material, where the visual flash signal is visible for viewing through the clear material. In another embodiment, the phase filter and one or more indicator circuits are mounted within an enclosure and are visible to a user accessing electrified components within the enclosure connected to the one or more phase conductors. In another embodiment, the one or more indicator circuits are in addition to a voltage indicator visible external to the enclosure. The voltage indicator provides an indication of voltage present on one or more of the electrified components and the one or more phase conductors.

A system for phase operation indication includes a load within an enclosure. The load is supplied by one or more phase conductors that enter the enclosure. The system includes a phase filter within the enclosure that filters a ground monitor signal from the one or more phase conductors and injects the ground monitor signal in an equipment grounding conductor run with the one or more phase conductors. The ground monitor signal includes a test frequency different than a line frequency of power supplied to the load. The system includes at least one indicator circuit connected to at least one of the one or more phase conductors. An indicator circuit of a phase conductor provides a visual flashing signal visible within the enclosure in response to a voltage being present on the phase conductor, each indicator circuit located at the phase filter.

In one embodiment, the indicator circuit includes an indicator capacitor that receives charge from the phase filter and a lamp circuit that discharges the indicator capacitor and provides light for the visual flashing in response to voltage across the indicator capacitor reaching a trigger voltage and stops discharging the indicator capacitor and stops providing light at a reset voltage. The phase filter includes a phase capacitor circuit for each of the one or more phase conductors. Each phase capacitor circuit includes a phase capacitor and each phase capacitor circuit is connected to one of the one or more phase conductors and to an input to an inductor circuit with an inductor. An output of the inductor circuit is connected to the equipment grounding conductor. The inductor circuit includes a fusible resistor circuit connected in series with the inductor. The fusible resistor circuit includes one or more fusible resistors connected in series, where the fusible resistor circuit forms an open circuit in response to current through the fusible resistor circuit above a current limit. In another embodiment, the phase filter and the at least one indicator circuit for the one or more phase conductors are potted in a clear material that allows the visual flashing signal to be viewed through the clear material.

Another system for phase operation indication includes an enclosure with one or more components connected to one or more phase conductors that exit the enclosure. The system includes a ground monitor within the enclosure. The ground monitor includes a signal generator. The system includes a phase filter within the enclosure that receives a ground monitor signal from the signal generator and injects the ground monitor signal on the one or more phase conductors. The ground monitor signal includes a test frequency different than a line frequency of power supplied to a load. The system includes at least one indicator circuit connected to at least one of the one or more phase conductors. An indicator circuit of a phase conductor provides a visual flashing signal visible within the enclosure in response to a voltage being present on the phase conductor. Each indicator circuit of the at least one indicator circuits is located at the phase filter.

In one embodiment, the indicator circuit includes an indicator capacitor that receives charge from the phase filter and a lamp circuit that discharges the indicator capacitor and provides light for the visual flashing in response to voltage across the indicator capacitor reaching a trigger voltage and stops discharging the indicator capacitor and stops providing light at a reset voltage. In the embodiment, the phase filter includes a phase capacitor circuit for each of the one or more phase conductors. Each phase capacitor circuit includes a phase capacitor and each phase capacitor circuit is connected to one of the one or more phase conductors and to an input to an inductor circuit that has an inductor. An output of the inductor circuit is connected to the signal generator. The inductor circuit includes a fusible resistor circuit connected in series with the inductor. The fusible resistor circuit includes one or more fusible resistors connected in series, where the fusible resistor circuit forms an open circuit in response to current through the fusible resistor circuit above a current limit. In another embodiment, the phase filter and the at least one indicator circuit for the one or more phase conductors are potted in a clear material that allows the visual flashing signal to be viewed through the clear material.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the invention may be combined in any suitable manner in one or more embodiments. In the following description, numerous specific details are provided, such as examples of hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
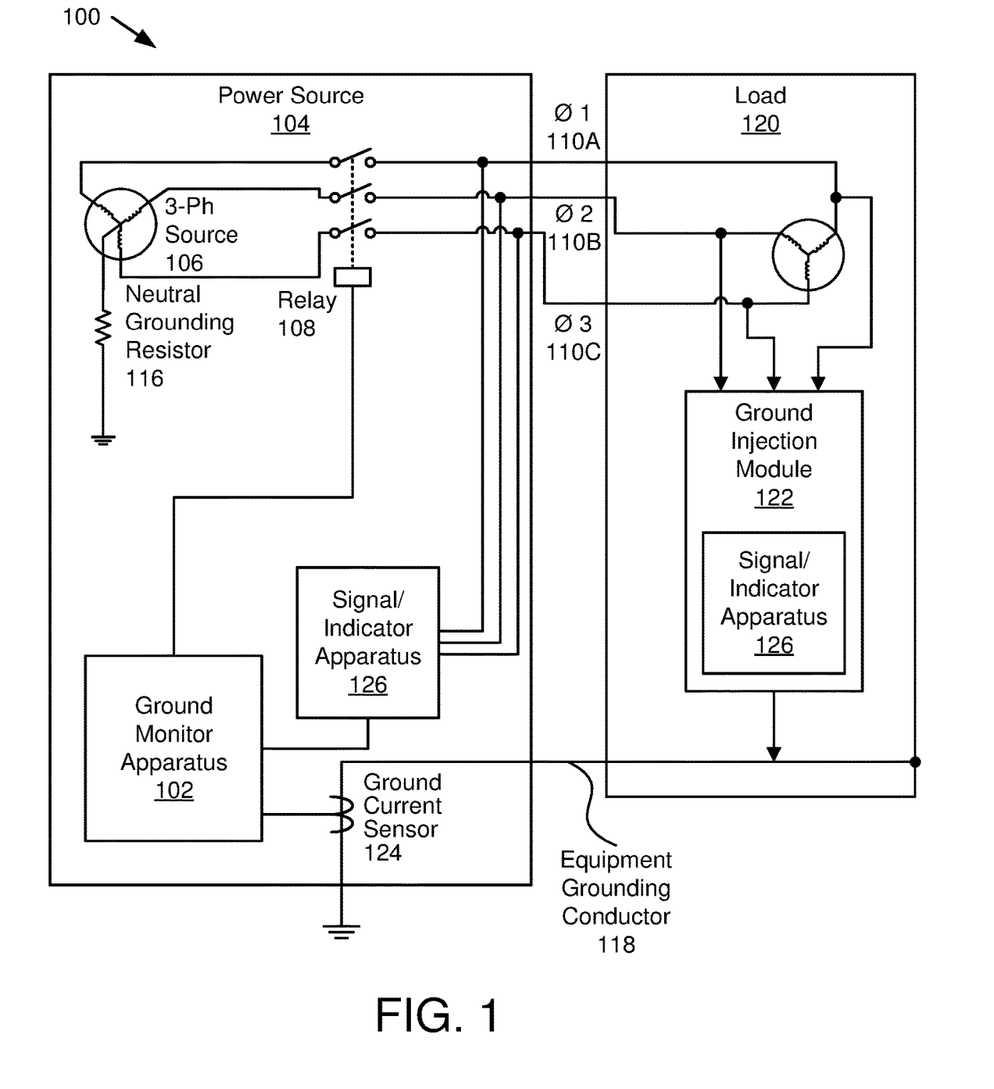
FIG. 1 is a schematic block diagram illustrating one embodiment of a system for phase operation indication.

FIG. 1 is schematic block diagram depicting one embodiment of a system 100 for monitoring ground current and indicates if conductors are powered. The system 100 includes a ground monitor apparatus 102, a power source 104, a three-phase power source 106, a relay 108, a first phase conductor 110A, a second phase conductor 110B, a third phase conductor 110C (collectively "phase conductors 110"), a neutral grounding resistor 116, an equipment grounding conductor 118, a load 120, a ground injection module 122, a ground current sensor 124 and a signal/indicator apparatus 126, which are described below.

While the system 100 depicted in FIG. 1 includes ground current monitoring, the signal/indicator apparatus 126 may be used in other systems 100 that include power conductors that pose a safety hazard for personnel and include a phase filter. The signal/indicator apparatus 126 filters a ground monitor signal from the phase conductors of a set of power cables or inject a ground monitor signal onto a set of power cables and also provides at least a visual indication that a conductor, such as a power cable for power transmission, bussing in electrical equipment, control wiring, metering wiring, etc. is energized. The visual indication may provide either a primary indication of an energized conductor or a backup indication.

One application of the signal/indicator apparatus 126 is in the mining industry where power sources 104, loads 120 and a set of power cables (i.e. the first phase conductor 110A, the second phase conductor 110B and the third phase conductor 110C) are mobile and where extra safety precautions are used compared to standard building electrical systems. In addition to the signal/indicator apparatus 126, ground current monitoring for the system 100 is required to help detect dangerous short circuit conditions, particularly in systems where a ground monitor signal is injected onto a set of power cables at a source and then the ground monitor signal is filtered from the fundamental frequency of the power cables and injected onto an equipment grounding conductor 118.

The system 100 includes, in one embodiment, a ground monitor apparatus 102 that monitors current in the equipment grounding conductor 118. The power source 104, in one embodiment, includes a three-phase power source 106. In one example, the three-phase power source 106 is a wye-connected source. The three-phase power source 106, in some embodiments, is grounded through a neutral grounding resistor 116 to limit fault current. In another embodiment, the three-phase power source 106 may be a delta-connected power source. In another embodiment, the power source 104 includes another type of power source, such as a single-phase power source or a direct current ("DC") power source.

The three-phase power source 106 may include some type of a transformer or generator, or maybe wired to another source (not shown), such as a utility power system, a solar power system, a fuel cell, etc. In another embodiment, the power source 104 may include multiple power sources. In a particular embodiment, the power source 104 may be configured for an application in a mine. The power source 104, in one example, is configured for mining applications and may be configured to meet requirements of the Mine Safety and Health Administration ("MSHA"). One of skill in the art will recognize other power sources 104 that may include a ground monitor apparatus 102.

In one embodiment, the power source 104 includes a relay 108. As used herein, contact and relay are used interchangeably. The relay 108 may include one or more contacts that may be normally open or normally closed and closing one of the contacts or allowing one of the contacts to close typically opens the relay 108. In another example, the relay 108 is a circuit breaker with a remote trip function. In other embodiments, opening one of the contacts opens the relay 108. In one example, the relay 108 is a three-phase contactor. The relay 108 may include a fault detection module (not shown) that sends a trip signal to the relay 108 on detection of an overcurrent condition. For example, a fault detection module may include current sensing and/or voltage sensing circuits may indicate an overcurrent or fault condition. The fault detection module may have an inverse time characteristic or other common protective relaying characteristic and may coordinate with other overcurrent protection devices upstream and downstream. The relay 108 may also be opened for other conditions, such as a manual command to open.

In one example, the relay 108 also includes the capability to be commanded open by the ground monitor apparatus 102. For example, the ground monitor apparatus 102 may send a command to open the relay 108 upon detection of a ground problem, such as a ground current different than expected. In another embodiment, the power source 104 includes a different type of power source, such as a single-phase source, and the relay 108 may include a different number of poles. In another example, the relay 108 may be a three-pole contactor. One of skill in the art will recognize other types of relays 108 that may be used in conjunction with the power source 104 that includes a ground monitor apparatus 102.

In one embodiment, the system 100 includes a set of power cables wired to a load 120. The set of power cables includes a first phase conductor 110A, a second phase conductor 110B, a third phase conductor 110C, and an equipment grounding conductor 118 and is typically bundled together in a conduit, a flexible conduit, or some other type of covering. In other embodiments, the set of power cables may include a neutral conductor, which may be referred to as a grounded conductor (not shown) wired to the load. Often the grounded conductor is white or has white markings. The equipment grounding conductor 118 is often green, marked with green, or includes one or more bare conductors. The equipment grounding conductor 118, also called a safety ground, is typically included to be a low impedance return path in case of a short circuit so fault current runs in the equipment grounding conductor 118 instead of in equipment, in the earth, etc. which is a safety hazard.

For safety, it is desirable to determine if the equipment grounding conductor 118 is properly connected between the power source 104 and the load 120. For example, if the equipment grounding conductor 118 is disconnected, has failed, or in some way is not properly connected between the power source 104 and the load 120, there may be a hidden danger within the system 100. For instance, if a short circuit occurs and the equipment grounding conductor 118 is not properly connected, current may flow through the ground from the load 120 to the power source 104 and may generate an electric field within the ground that may cause an electrical hazard for personnel. In one embodiment, the ground monitor apparatus 102 helps to ensure that the equipment grounding conductor 118 is properly connected and functioning.

In some embodiments, the ground monitor apparatus 102 injects a ground monitor signal into the phase conductors 110 of the power cable assembly through the signal/indicator apparatus 126 and the ground injection module 122 filters the ground monitor signal from the set of power cables and injects the ground monitor signal in the equipment grounding conductor 118 to sense an undesirable condition, such as a high impedance within the equipment grounding conductor 118, or other failure in the equipment grounding conductor 118 or in the ground monitor apparatus 102 and associated components. In one embodiment, a ground current sensor 124 senses current in the equipment grounding conductor 118. In one example, the ground current sensor 124 includes a current transformer that senses current in the equipment grounding conductor 118. In another example, the ground current sensor 124 includes a hall effect sensor or other current sensor. While the ground current sensor 124 is external to the ground monitor apparatus 102 in FIG. 1, in other embodiments the ground current sensor 124 is located internal to the ground monitor apparatus 102. The ground current sensor 124 is discussed in further detail with regard to the apparatuses 200, 300, 400 of FIGS. 2-4 of U.S. patent application Ser. No. 15/215,502, filed Jul. 20, 2016 for Dale Curtis [hereinafter "the '502 Application"], which is hereinafter incorporated by reference.

In another embodiment, the power source 104 includes a ground wire device ("GWD")(not shown). In one example, the GWD includes back-to-back diodes and the equipment grounding conductor 118 is connected to back to back diodes, and the back-to-back diodes are also connected to the chassis ground of the power source 104. The back-to-back diodes, in some embodiments, provide some signal isolation for monitoring injected ground monitor signal in the equipment grounding conductor 118. In addition, the back-to-back diodes in the GWD help to keep any voltage on the equipment grounding conductor 118 to within a diode drop of the chassis ground.

In another embodiment, a saturable coil may replace the back-to-back diodes. The saturable coil, in one embodiment, may help keep voltage on the equipment grounding conductor 118 within a saturation voltage of the chassis ground. In another embodiment, the system 100 does not include a GWD but the equipment grounding conductor 118 is connected to chassis ground of the power source 104. One skilled in the art will recognize that various other methods exist that can help limit the voltage potential between the equipment grounding conductor 118 and the chassis ground, while providing some signal isolation for monitoring the injected ground monitor signal in the equipment grounding conductor 118. In one embodiment, the system 100 includes a watchdog apparatus (not shown) in the ground monitor apparatus 102. The watchdog apparatus, in one embodiment, determines if the ground monitor apparatus 102 is functioning properly.

The system 100, in various embodiments, includes one or more signal/indicator apparatuses 126, which include a phase filter and an indicator circuit. The phase filter includes filtering circuitry that filters out a fundamental frequency of power from the power source 104. In one embodiment, the phase filter is bidirectional and can be used to both inject a ground monitor signal onto the set of power cables at the power source 104 and to filter out the fundamental frequency to isolate the injected ground monitor signal at the load 120 for injection of the ground monitor signal onto the equipment grounding conductor 118. The indicator circuit provides a visual indication of one or more energized conductors (e.g. 110) at the power source 104 and/or load 120.

Where a system, such as the system 100 of FIG. 1, requires a phase filter, including indicator circuits with the phase filter provides an additional level of safety by providing an indication of energized phase conductors 110 within an enclosure to personnel accessing equipment within the enclosure. In one embodiment, the equipment enclosure is an equipment enclosure, such as a metal box. In another embodiment, the enclosure is another structure, such as a fenced-off area. The phase filter and indicator circuit is described in more detail below.

Figure 2A:
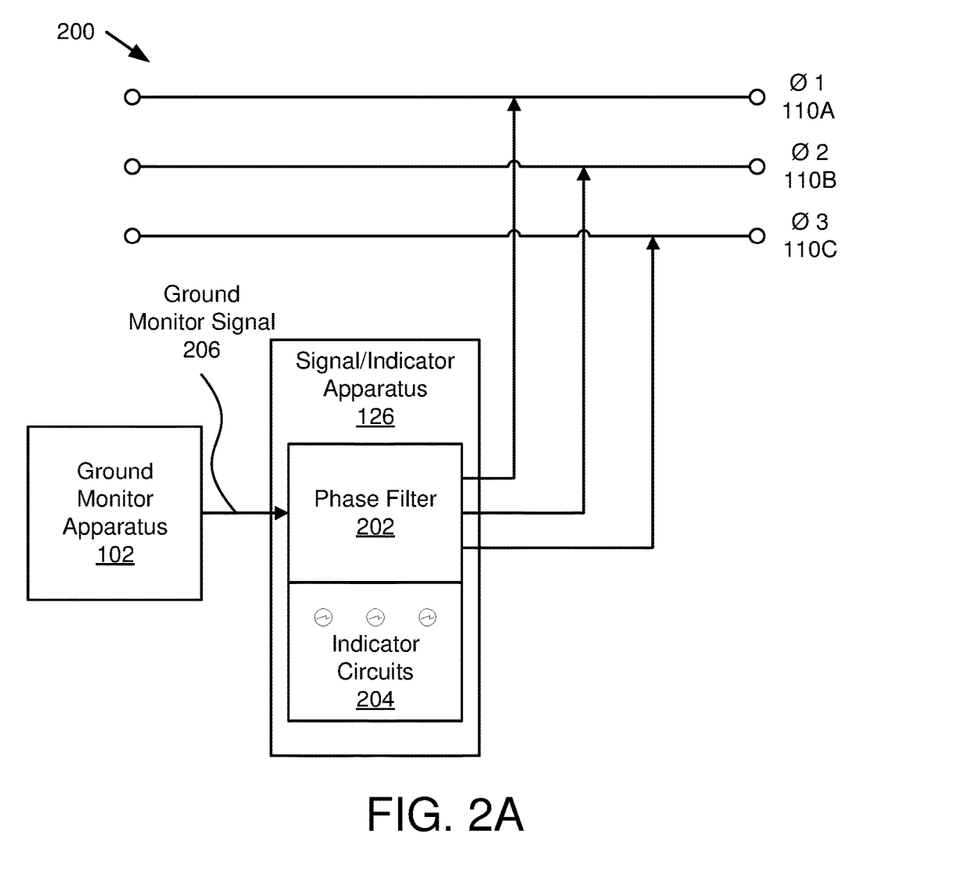
FIG. 2A is a schematic block diagram illustrating one embodiment of an apparatus with a phase filter and indicator circuits for phase operation indication.

FIG. 2A is a schematic block diagram illustrating one embodiment of an apparatus 200 with a phase filter 202 and indicator circuits 204 for phase operation indication. The apparatus 200 includes a set of power cables with a first phase conductor 110A, a second phase conductor 110B and a third phase conductor 110C, a ground monitor apparatus 102, a signal/indicator apparatus 126 with the phase filter 202 and indicator circuits 204, which are described below. The apparatus 200 is typically used in conjunction with a power source 104.

The ground monitor apparatus 102 generates a ground monitor signal 206, which is transmitted to the phase filter 202. The phase filter 202 receives the ground monitor signal 206 from the ground monitor apparatus 102, which is a signal generator, and injects the ground monitor signal 206 on one or more phase conductors (e.g. 110). The ground monitor signal 206 includes a test frequency different than a line frequency of power supplied through the one or more phase conductors 110 to a load, such as the load 120 of the system 100 of FIG. 1.

In one embodiment, the test frequency is higher than the line frequency and the phase filter 202 includes a band pass filter. In the embodiment depicted in FIG. 2A, the band pass filter combines the test signal with power on the phase conductors 110 operating at the line frequency while blocking the line frequency from the signal generator.

The signal/indicator apparatus 126 includes at least one indicator circuit 204 connected to at least one of the one or more phase conductors 110. Where there is a single phase conductor 110, there may be a single indicator circuit 204. Where there are multiple phase conductors (e.g. 110A, 110B or 110A, 110B, 110C) there is at least one indicator circuit 204 for at least one of the phase conductors (110A, 110B or 110A, 110B, 110C). In one embodiment, each phase conductor (e.g. 110A, 110B, 110C) is connected to a separate indicator circuit 204. In another embodiment, an indicator circuit 204 is connected to two or more phase conductors (e.g. 110A, 110B or 110A, 110B, 110C), for example through a rectifier. An indicator circuit of a phase conductor (e.g. 110) provides a visual flashing signal in response to a voltage being present on the phase conductor 110. Each indicator circuit is located at the phase filter.

In one embodiment, the phase filter 202 and one or more indicator circuits 204 are mounted within an enclosure and are visible to a user accessing electrified components within the enclosure connected to the one or more phase conductors 110. In the embodiment depicted in FIG. 2A, the enclosure may be an enclosure for the power source 104 where personnel opening the power source 104 may view the indicators circuits 204 to determine if any of the phase conductors 110 is energized. In another embodiment, the one or more indicator circuits 204 are in addition to a voltage indicator visible external to the enclosure. The voltage indicator provides an indication of voltage present on one or more of the electrified components and the one or more phase conductors 110 of the enclosure.

For example, the power source 104 may have a handle, switch, etc. that opens the relay 108 so that personnel accessing the power source 104 may believe that the relay 108 is open when the handle or switch is in an open position such that the phase conductors 110 are not energized. In another embodiment, the voltage indicator is a voltage meter or other indicator visible on the exterior of the enclosure that indicates if the phase conductors 110 are energized. Beneficially, the one or more indicator circuits 204 provide a secondary means for determining if the phase conductors 110 are energized.

Figure 2B:
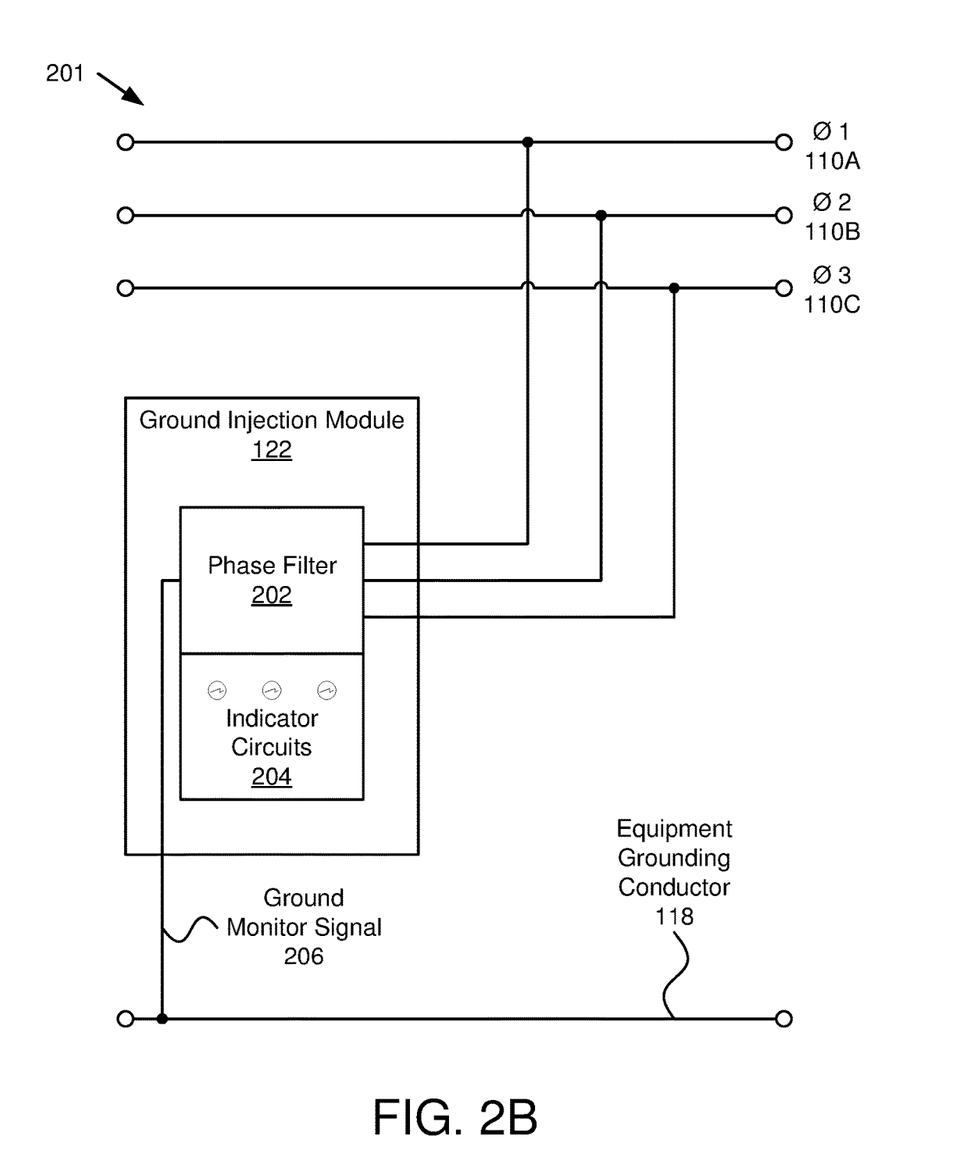
FIG. 2B is a schematic block diagram illustrating one embodiment of an apparatus with a phase filter and indicator circuits in a ground injection module for phase operation indication.

FIG. 2B is a schematic block diagram illustrating one embodiment of an apparatus 201 with a phase filter 202 and indicator circuits 204 in a ground injection module 122 for phase operation indication. The apparatus 201 includes a set of power cables with a first phase conductor 110A, a second phase conductor 110B a third phase conductor 110C, and an equipment grounding conductor 118. The apparatus 201 may be in a load 120.

In the embodiment of FIG. 2B, the phase filter 202 filters a ground monitor signal 206 from one or more phase conductors 110 supplying power to a load (e.g. load 120) and injects the ground monitor signal 206 in an equipment grounding conductor 118 run with the one or more phase conductors 110. For example, the equipment grounding conductor 118 and phase conductors 110 could be in a conduit or jacket binding the conductors 118, 110 together. In another embodiment, the equipment grounding conductors are run from a power source 104 to a load 120 which are separated by a distance, for example, overhead, in a tunnel or duct, down a mine shaft, etc.

As with the apparatus 201 of FIG. 2A, there may be a single-phase conductor 110 or multiple phase conductors (e.g. 110A, 110B or 110A, 110B, 110C). The phase filter 202 may be bidirectional and in one embodiment is the same as the phase filter 202 of the apparatus 200 of FIG. 2A. The at least one indicator circuit 204 (one for each phase conductor 110A, 110B, and/or 110C, or less in another embodiment) may also be similar to those described above in relation to the apparatus 200 of FIG. 2A. In another embodiment, the phase filter 202 differs from the phase filter 202 of FIG. 2A. For example, the phase filter 202 of the apparatus 201 of FIG. 2B may have different components and/or may be configured differently than the phase filter 202 of the apparatus 200 of FIG. 2A.

Figure 3:
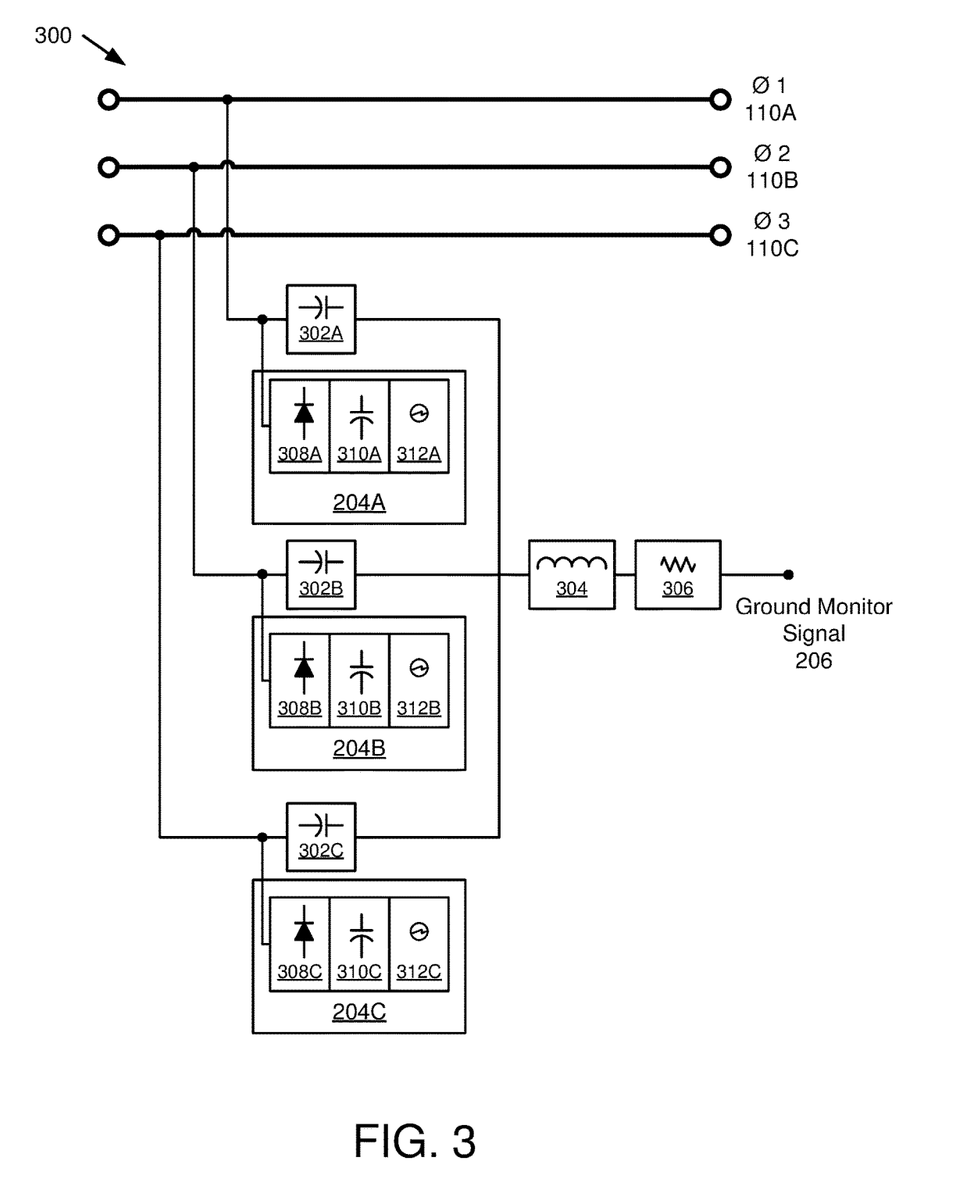
FIG. 3 is a schematic block diagram illustrating another embodiment of an apparatus with a phase filter and indicator circuits for phase operation indication.

FIG. 3 is a schematic block diagram illustrating another embodiment of an apparatus 300 with a phase filter 202 and indicator circuits 204 for phase operation indication. The apparatus 300 could be used for injection of a ground monitor signal 206 onto phase conductors 110 or to filter out the line frequency of phase conductors 110 and inject the ground monitor signal 206 in an equipment grounding conductor 118.

The apparatus 300 includes a phase capacitor circuit 302A, 302B, 302C (collectively "302") for each of the one or more phase conductors 110. Each phase capacitor circuit 302 includes a phase capacitor and each phase capacitor circuit 302 is connected to one of the one or more phase conductors 110 and to an input to an inductor circuit 304 that includes an inductor. The inductor may include two or more inductors connected in series and/or in parallel. As used herein, "inductor" may include one or more inductors. An output of the inductor circuit 304 is connected to the equipment grounding conductor 118 or the signal generator, and may be connected to the equipment grounding conductor 118 or the signal generator through a fusible resistor circuit 306, as depicted in the embodiment of FIG. 3. The phase capacitor circuits 302 may each include one or more capacitors connected in series and/or parallel. As used herein "capacitor" includes one or more capacitors in a capacitor circuit 302. The phase capacitor circuits 302 also may each include additional components, such as resistors and other components that may serve to dampen transients, etc. In addition, the inductor circuit 304 may include additional components.

The phase capacitors of the phase capacitor circuit 302 and the inductor of the inductor circuit 304 typically form a filter that may filter one or more frequencies while allowing the test frequency of the ground monitor signal 206. In one embodiment, the phase capacitor and inductor form a band pass filter that filters out the fundamental frequency of the one or more phase conductors 110. The band pass filter may also filter out high frequencies above the test frequency of the ground monitor signal 206. The apparatus 300, in some embodiments, may include other components that are part of the band pass filter. Components such as the fusible resistor circuit 306 or other resistors in the phase capacitor circuits 302 and/or inductor circuit 304 may also contribute to the filtering function of the band pass filter.

The apparatus 300 also includes, for each phase conductor 110A, 110B, 110C, a rectification circuit 308A, 308B, 308C (collectively "308"), an indicator capacitor 310A, 310B, 310C (collectively "310"), and a lamp circuit 312A, 312B, 312C (collectively "312"). The indicator capacitors 310 receive charge from the connected phase conductor 110 directly or through the connected phase filter 204. The lamp circuits 312 discharge the indicator capacitors 310 and provide light for the visual flashing in response to voltage across the indicator capacitors 310 reaching a trigger voltage and the lamp circuits 312 stop discharging the indicator capacitors 310 and stop providing light at a reset voltage.

During discharge of the indicator capacitors 310, the lamp circuits 312 typically receive current from the indicator capacitors 310, which may provide energy for the visual flashing signal of the indicator circuits 204. The indicator circuits 204 may include appropriate hardware circuits or other mechanisms to start discharging the indicator capacitors 310 at the trigger voltage and to stop discharging at the reset voltage. The indicator circuits 204 may include appropriate hardware circuits or other mechanisms to provide the visual flashing signal.

In one embodiment, each lamp circuit 312 includes a relaxation oscillator and associated phase capacitor 310, which discharges the connected indicator capacitor 310 at the trigger voltage and stops discharging at the reset voltage. In another embodiment, each lamp circuit 312 includes a gas discharge lamp, such as a neon lamp, that lights at the trigger voltage and stops producing light at the reset voltage. Certain gas discharge lamps are a component of a relaxation oscillator, which may also include other components. Other embodiments may include op amps, resistors, a lamp and other components to form the relaxation oscillator of a lamp circuit 312 and associated phase capacitor 310.

The rectification circuit 308 rectifies power from the connected phase conductor 110. In one embodiment, the rectification circuit 308 includes one or more rectification components arranged to rectify power from the phase conductors 110. For example, the rectification components may include diodes, switches or other rectifiers. In one embodiment, the rectification circuits 308 include a full-wave rectifier, for example arranged as a bridge rectifier circuit. In another embodiment, the rectification circuits 308 may include a half-wave rectifier. One of skill in the art will recognize other components and topologies that may be used in the rectification circuits 308 to rectify power from the connected phase conductor 110.

The fusible resistor circuit 306 is connected in series with the inductor circuit 304. The fusible resistor circuit 306 may be located between the inductor circuit 304 and the connected signal generator or equipment grounding conductor 118. The fusible resistor circuit 306 forms an open circuit in response to current through the fusible resistor circuit 306 being above a current limit. In one embodiment, the fusible resistor circuit 306 includes one or more fusible resistors connected in series, where the fusible resistor circuit is capable of forming an open circuit in response to current through the fusible resistor circuit above a current limit. The number of fusible resistors may be chosen to provide a specific open circuit gap length, and may also be chosen to have a particular resistance. The resistance of the fusible resistors may be chosen as part of the band pass filter design.

In other embodiments, the apparatus 300 may not include a fusible resistor circuit 306. As an alternative to fusible resistors, fusing may be provided through design of printed circuit board ("PCB") traces where size of a trace in one or more locations may act as a fuse. In other embodiments, the apparatus 300 includes a fuse instead of a fusible circuit 306 to provide fusing. In the embodiment, the fusible resistor circuit 306 may be replaced by resistors that do not intentionally have a fusing function.

The apparatus 300 provides both phase filtering as well as an indication of whether or not a phase conductor (e.g. 110A) is energized by providing a visual flashing signal when voltage is present on a phase conductor 110. In one embodiment, the indicator capacitors 310 and components of the connected lamp circuits 312 are chosen to provide a visual flashing signal within a particular frequency range. The frequency range may be chosen based on a possible voltage range of the one or more phase conductors 110. For example, the apparatus 300 may be used with various system voltages, such as a 120/208 volt ("V") system, a 277/480 V system, a 600 V system, etc. and may include in some embodiments voltages under 1000 V.

In another embodiment, each phase filter 202 is indirectly connected to a phase conductor 110. For example, the voltage of the phase conductors 110 may be higher than 1000 V and may be high enough where direct connection would pose a safety hazard. The phase filters 202 may be connected though a transformer or other mechanism that scales the voltage of the phase conductors 110 down to a more convenient level.

Figure 4:
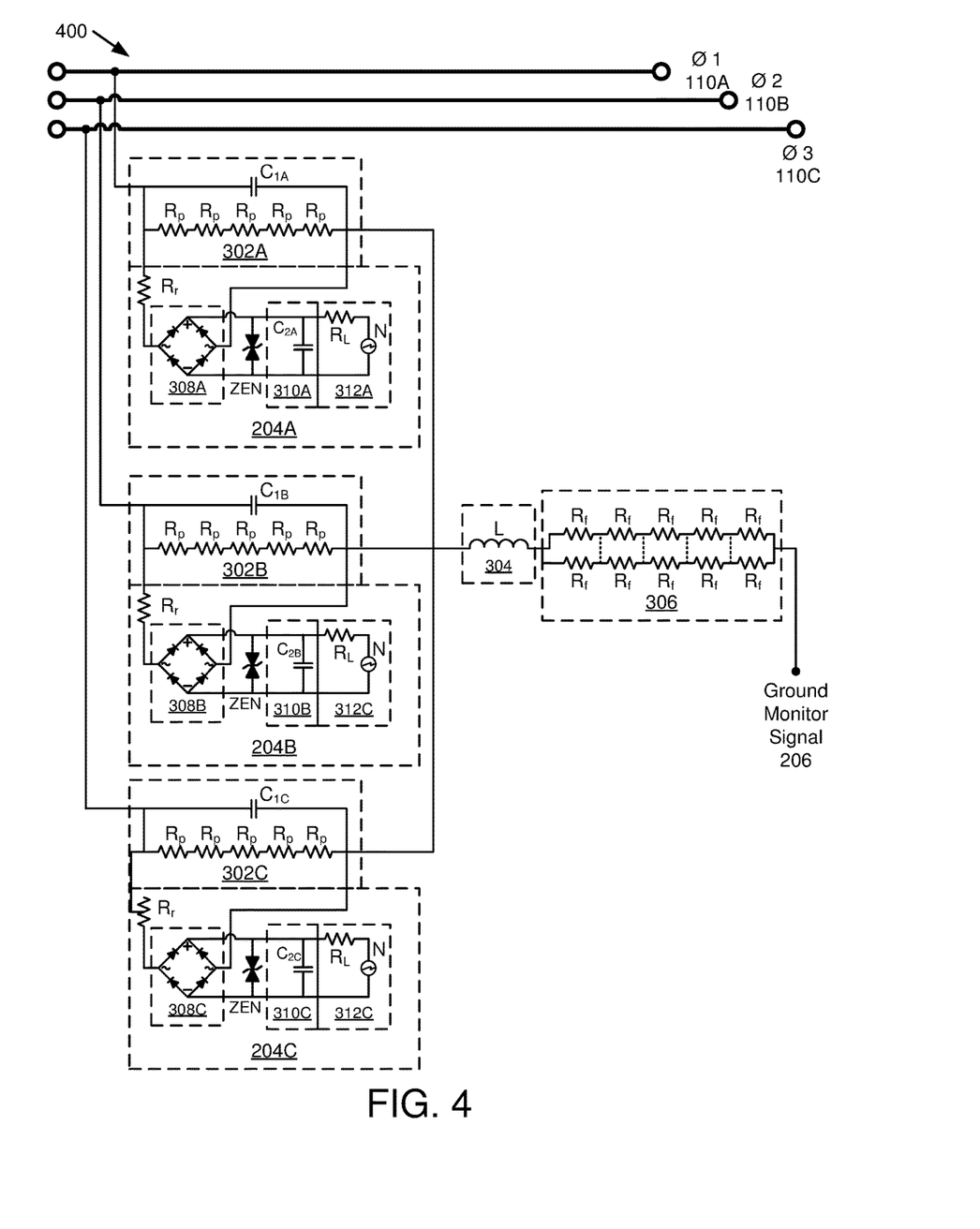
FIG. 4 is a circuit diagram for one embodiment of an apparatus with a phase filter and indicator circuits for phase operation indication.

FIG. 4 is a circuit diagram for one embodiment of an apparatus 400 with a phase filter 202 and indicator circuits 204 for phase operation indication. The apparatus 400 includes phase conductors 110A, 110B, 110C, phase capacitor circuits 302A, 302B, 302C, indicator circuits 204A, 204B, 204C, an inductor circuit 304, and fusible resistor circuit 306, which are substantially similar to those described above in relation to the apparatuses 200, 201, 300 of FIGS. 2A, 2B, 3.

In one embodiment, the phase capacitor circuits 302 may include a phase capacitor $C_{1A}$, $C_{1B}$, $C_{1C}$ in parallel with resistors $R_P$. For example, the resistors may be sized to discharge the phase capacitors $C_{1A}$, $C_{1B}$, $C_{1C}$ when the phase conductors 110 are not energized. Other embodiments may include other components.

The rectification circuit 308 of a phase is depicted with diodes arranged in a diode bridge arrangement, which provides full-wave rectification of voltage across the phase filter 204. A back-to-back Zener diode (ZEN in FIG. 4) may be connected across the output of the rectification circuit 308 to reduce voltage spikes that may be harmful. Other embodiments may include other transient protection, such as a metal oxide varister ("MOV"), gas discharge tube, or other transient voltage surge suppression device. A resistor Rr is connected between each phase filter 204 and the connected indicator circuit 204, which may limit current and reduce voltage to the indicator circuit 204.

The lamp circuit 312 includes a resistor $R_L$ and a neon lamp N. The resistor $R_L$ is chosen along the indicator capacitor 310 to select a flashing frequency for the expected voltage range. The neon lamp N is selected with a particular trigger voltage and reset voltage with respect to voltages that are anticipated across the neon lamp N. Note that other gas discharge lamps may be used or other relaxation oscillator circuits that include a lamp, such as a light-emitting diode ("LED").

The fusible resistor circuit 306, in one embodiment, includes two strings of fusible resistors $R_f$ connected in parallel where each string includes several fusible resistors $R_f$ in series. The fusible resistors $R_f$ are selected to have an overall resistance that fits with a design of filtering of the phase filters 202 as well as having a particular current limit and a physical dimension of an open circuit if the fusible resistors are open due to overcurrent. One of skill in the art will recognize other design considerations when choosing the fusible resistors $R_f$. The ground monitor signal 206 is available at one side of the fusible resistor circuit 306, but in other designs the position of the fusible resistor circuit 306 and the inductor circuit 304 may be reversed.

Figure 5:
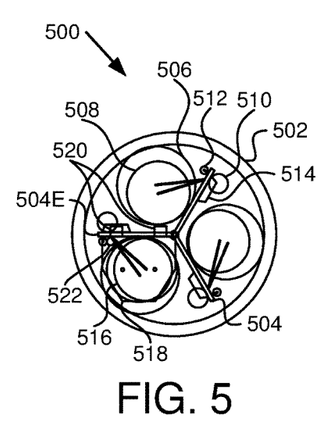
FIG. 5 is an end view of one embodiment of a signal/indicator apparatus.

FIG. 5 is an end view 500 of one embodiment of a signal/indicator apparatus 126. In one embodiment, the signal/indicator apparatus 126 is enclosed in a container that includes at least some clear sections for viewing the indicator circuits 204. In the embodiment depicted in FIG. 5, the signal/indicator apparatus 126 is enclosed in a cylinder 502. The cylinder 502, in one example, is clear and may be made of a clear plastic, a glass or other clear substance. In another embodiment, the cylinder 502 is partially clear. Components of the signal/indicator apparatus 126 are mounted on circuit boards 504 that are arranged in three parts that are joined in the middle of the cylinder 502 and are arranged 120 degrees apart. The circuit boards 504 may be designed to interlock. Each circuit board 504 includes a phase capacitor 506 (e.g. $C_{1A}$), an indicator capacitor 508 (e.g. $C_{2A}$), and a lamp 510, such as a neon lamp N. The circuit boards 504 may also include resistors $R_P$ 512 and other components 514, such as resistor, diodes. One circuit board 504E, in the depicted embodiment, is extended to include the inductor L 516 and fusible resistors $R_f$ 522 where the inductor L 516 is connected to a small inductor circuit board 518 inserted with tabs 520 into the extended circuit board 504E. The fusible resistors $R_f$ 522 are also located on this extended circuit board 504E.

In one embodiment, once the circuit boards 504 with components are interconnected and placed in the cylinder 502, the circuit boards 504 and components, space around the components and in the cylinder 502 is filled with a potting material. In one embodiment, at least a portion of the potting material is clear to provide visibility to the neon lamps N. In another embodiment, all of the potting material is clear. The potting material, in one embodiment, has a heat transfer ability to transfer heat from the components of the signal/indicator apparatus 126 without damaging the components.

Figure 6:
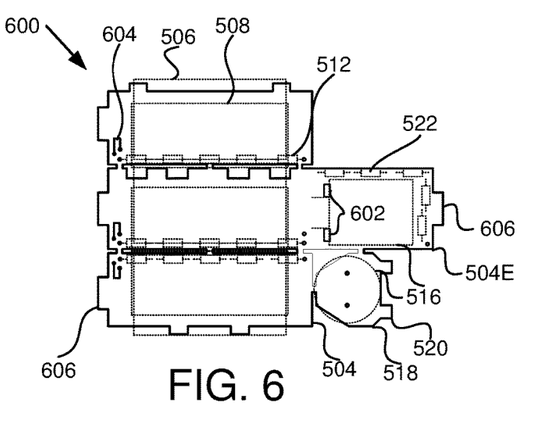
FIG. 6 is a top view of a circuit board design of the signal/indicator apparatus depicted in FIG. 5.
Figure 7:
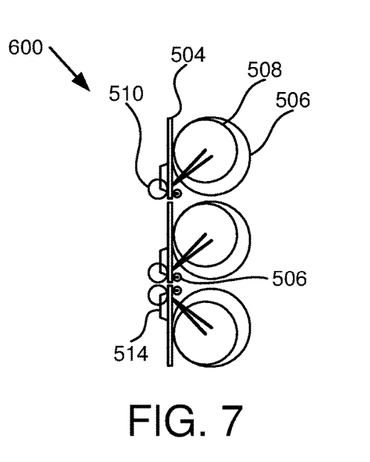
FIG. 7 is an end view of a circuit board design of the signal/indicator apparatus depicted in FIG. 5.

FIG. 6 is a top view of a circuit board design 600 of the signal/indicator apparatus 126 depicted in FIG. 5 and FIG. 7 is an end view of a circuit board design of the signal/indicator apparatus 126 depicted in FIG. 5. The circuit board 504 includes a top portion, a middle portion that is extended (i.e. 504E) and a bottom portion that includes the inductor circuit board 518 for the inductor L where the various portions can be separated. The circuit board 504 includes outlines for where the components will be placed, including the phase capacitors 506, indicator capacitors 508, resistors $R_P$ 512, inductor L 516 and fusible resistors $R_f$ 522. The middle, extended circuit board 504E includes slots 602 for the tabs 520 of the inductor circuit board 518. The circuit boards 504 may also include trace fuses 604 and tabs 606 that insert into slots in the cylinder 502 and cap depicted in FIG. 8.

Figure 8:
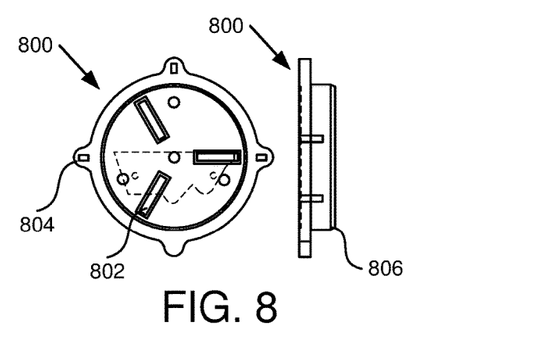
FIG. 8 is a top view and a side view of a cap for the signal/indicator apparatus depicted in FIG. 5.

FIG. 8 is a top view and a side view of a cap 800 for the signal/indicator apparatus 126 depicted in FIG. 5. The cap 800 is sized to fit over an end of the cylinder 502 and includes slots 802 for the tabs 606 of the circuit boards 504. The cap 800 may also include ears 804 for mounting and may prevent zip-ties, straps, etc. from sliding off of the cylinder 502. The cylinder 502 may also include similar ears, grooves, etc. to prevent slippage of zip-ties, straps, etc. from sliding. In one embodiment, the cap 800 is made of a molded plastic. For example, the cap 800 may be made out of a bulk polyester or other similar material.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
   a phase filter that one of:
      filters a ground monitor signal from one or more phase conductors supplying power to a load and injects the ground monitor signal in an equipment grounding conductor run with the one or more phase conductors; and
      receives the ground monitor signal from a signal generator and injects the ground monitor signal on the one or more phase conductors,
      wherein the ground monitor signal comprises a test frequency different than a line frequency of power supplied to the load and wherein the test frequency is higher than the line frequency; and
   at least one indicator circuit connected to one or more phases of the one or more phase conductors, an indicator circuit of a phase conductor providing a visual flashing signal in response to a voltage being present on the phase conductor, each indicator circuit of the at least one indicator circuits located at the phase filter.

2. The apparatus of claim 1, wherein the indicator circuit further comprises an indicator capacitor that receives charge from the connected phase conductor and a lamp circuit that discharges the indicator capacitor and provides light for the visual flashing in response to voltage across the indicator capacitor reaching a trigger voltage and stops discharging the indicator capacitor and stops providing light at a reset voltage.

3. The apparatus of claim 2, wherein the lamp circuit comprises a neon lamp, wherein the neon lamp lights at the trigger voltage and stops producing light at the reset voltage.

4. The apparatus of claim 2, wherein the indicator circuit comprises a relaxation oscillator.

5. The apparatus of claim 2, wherein each indicator circuit of the at least one indicator circuits comprises a rectification circuit that rectifies power from the connected phase conductor.

6. The apparatus of claim 1, wherein the visual flashing signal provides light at a frequency lower than the line frequency.

7. The apparatus of claim 1, wherein the phase filter comprises a band pass filter that one of:
   filters out the line frequency and passes the test frequency to the equipment grounding conductor; and
   combines the test signal with the line frequency while blocking the line frequency from the signal generator.

8. The apparatus of claim 1, wherein the phase filter comprises a phase capacitor circuit for each of the one or more phase conductors, each phase capacitor circuit comprising a phase capacitor and each phase capacitor circuit connected to one of the one or more phase conductors and to an input to an inductor circuit comprising an inductor, an output of the inductor circuit connected to one of the equipment grounding conductor and the signal generator.

9. The apparatus of claim 8, wherein the indicator circuit comprises a fusible resistor circuit connected in series with the inductor circuit, the fusible resistor circuit comprising one or more fusible resistors connected in series, wherein the fusible resistor circuit forms an open circuit in response to current through the fusible resistor circuit above a current limit.

10. The apparatus of claim 9, wherein the fusible resistor circuit is arranged to form a gap when in an open circuit condition, wherein the gap comprises a gap length sufficient to prevent an arc forming across the gap for voltage across the gap below an upper voltage limit.

11. The apparatus of claim 1, wherein each indicator circuit of the at least one indicators circuits for the one or more phase conductors is potted in a clear material that allows the visual flashing signal to be viewed through the clear material.

12. The apparatus of claim 11, wherein the phase filter is potted together with each indicator circuit of the at least one indicator circuits for the one or more phase conductors in the clear material, wherein the visual flash signal is visible for viewing through the clear material.

13. The apparatus of claim 1, wherein the phase filter and one or more indicator circuits are mounted within an enclosure and are visible to a user accessing electrified components within the enclosure connected to the one or more phase conductors.

14. The apparatus of claim 13, wherein the one or more indicator circuits are in addition to a voltage indicator visible external to the enclosure, wherein the voltage indicator provides an indication of voltage present on one or more of the electrified components and the one or more phase conductors.

15. A system comprising:
   a load within an enclosure, the load supplied by one or more phase conductors that enter the enclosure;
   a phase filter within the enclosure that filters a ground monitor signal from the one or more phase conductors and injects the ground monitor signal in an equipment grounding conductor run with the one or more phase conductors, the ground monitor signal comprising a test frequency different than a line frequency of power supplied to the load; and
   at least one indicator circuit connected to a phase of the one or more phase conductors, an indicator circuit of a phase conductor providing a visual flashing signal visible within the enclosure in response to a voltage being present on the phase conductor, each indicator circuit of the at least one indicator circuits located at the phase filter.

16. The system of claim 15, wherein:
   the indicator circuit further comprises an indicator capacitor that receives charge from the phase filter and a lamp circuit that discharges the indicator capacitor and provides light for the visual flashing in response to voltage across the indicator capacitor reaching a trigger voltage and stops discharging the indicator capacitor and stops providing light at a reset voltage; and the phase filter comprises a phase capacitor circuit for each of the one or more phase conductors, each phase capacitor circuit comprising a phase capacitor and each phase capacitor circuit connected to one of the one or more phase conductors and to an input to an inductor circuit comprising an inductor, an output of the inductor circuit connected to the equipment grounding conductor, the inductor circuit comprises a fusible resistor circuit connected in series with the inductor, the fusible resistor circuit comprising one or more fusible resistors connected in series, wherein the fusible resistor circuit forms an open circuit in response to current through the fusible resistor circuit above a current limit.

17. The system of claim 15, wherein the phase filter and the at least one indicator circuit for the one or more phase conductors are potted in a clear material that allows the visual flashing signal to be viewed through the clear material.

18. A system comprising:
an enclosure comprising one or more components connected to one or more phase conductors that exit the enclosure;
a ground monitor within the enclosure, the ground monitor comprising a signal generator;
a phase filter within the enclosure that receives a ground monitor signal from the signal generator and injects the ground monitor signal on the one or more phase conductors, the ground monitor signal comprising a test frequency different than a line frequency of power supplied to a load; and
at least one indicator circuit connected to one or more of the one or more phase conductors, an indicator circuit of a phase conductor providing a visual flashing signal visible within the enclosure in response to a voltage being present on the phase conductor, each indicator circuit of the at least one indicator circuits located at the phase filter.

19. The system of claim 18, wherein:
the indicator circuit further comprises an indicator capacitor that receives charge from the phase filter and a lamp circuit that discharges the indicator capacitor and provides light for the visual flashing in response to voltage across the indicator capacitor reaching a trigger voltage and stops discharging the indicator capacitor and stops providing light at a reset voltage; and
the phase filter comprises a phase capacitor circuit for each of the one or more phase conductors, each phase capacitor circuit comprising a phase capacitor and each phase capacitor circuit connected to one of the one or more phase conductors and to an input to an inductor circuit comprising an inductor, an output of the inductor circuit connected to the signal generator, the inductor circuit comprises a fusible resistor circuit connected in series with the inductor, the fusible resistor circuit comprising one or more fusible resistors connected in series, wherein the fusible resistor circuit forms an open circuit in response to current through the fusible resistor circuit above a current limit.

20. The system of claim 18, wherein the phase filter and the at least one indicator circuit for the one or more phase conductors are potted in a clear material that allows the visual flashing signal to be viewed through the clear material.

* * * * *